United States Patent [19]
Fuji

[11] Patent Number: 5,444,688
[45] Date of Patent: Aug. 22, 1995

[54] INFORMATION REPRODUCING CIRCUIT
[75] Inventor: Hiroshi Fuji, Nara, Japan
[73] Assignee: Sharp Kabushiki Kaisha, Osaka, Japan
[21] Appl. No.: 259,741
[22] Filed: Jun. 13, 1994

Related U.S. Application Data
[63] Continuation of Ser. No. 920,347, Jul. 27, 1992, abandoned.

[51] Int. Cl.6 .............................................. G11B 7/00
[52] U.S. Cl. ...................................... 369/59; 369/47; 369/124
[58] Field of Search ................. 369/53, 54, 58, 124, 369/47, 44.25, 59, 121, 32; 360/65, 32

[56] References Cited
U.S. PATENT DOCUMENTS
4,575,835 3/1986 Nishikawa et al. ............... 369/59 X
4,706,236 11/1987 Yoda .
4,805,047 2/1989 Nasu et al. .
5,134,607 7/1992 Fuji et al. ........................ 369/121 X

FOREIGN PATENT DOCUMENTS
58-175116 10/1983 Japan .
62-083671 4/1987 Japan .
62-185277 8/1987 Japan .
63-94406 4/1988 Japan .
63-094406 4/1988 Japan .
1-13658 3/1989 Japan .

Primary Examiner—Georgia Y. Epps
Assistant Examiner—Muhammad N. Edun
Attorney, Agent, or Firm—David G. Conlin; Kevin J. Fournier

[57] ABSTRACT

An information reproducing circuit which has a generator, having virtually the same frequency transfer characteristic as a recorder, for generating a slice signal whose level is larger than a negative peak level of a signal read out from a recording medium and smaller than a positive peak level thereof and a comparator for comparing a level of the readout signal and that of the slice signal so as to convert the readout signal into binary digits. The information reproducing circuit is designed to cancel jitter, contained in the readout signal, which occurs due to the frequency transfer characteristic of the recorder is cancelled by using the level variation of the slice signal, which occurs due to the frequency transfer characteristic of the generator. Therefore, a signal read out from the recording medium, even if jitter is contained therein, can be accurately converted into binary digits. Thus, the reliability of the reproduced data can be enhanced.

12 Claims, 10 Drawing Sheets 0 0 1 0 0 1 0 0 0 0 0 0 1 0 0 1 0 0 0 0 0 0 1 0 0
FIG. 10(a) PRIOR ART
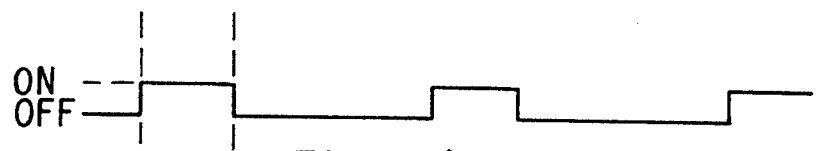
FIG. 10(b) PRIOR ART
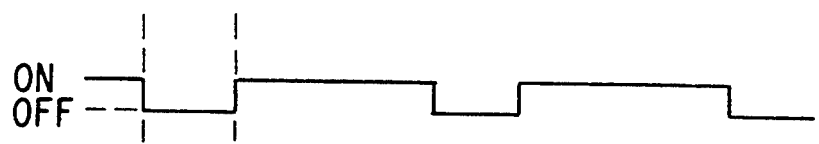
FIG. 10(c) PRIOR ART
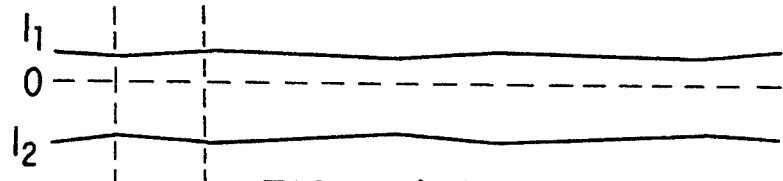
FIG. 10(d) PRIOR ART
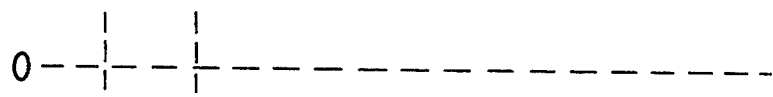
FIG. 10(e) PRIOR ART
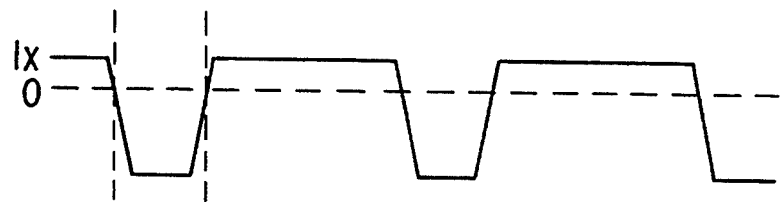
FIG. 10(f) PRIOR ART
| Lx | 0 | Lx | 0 | Lx |
FIG. 10(g) PRIOR ART
| 0 | Lx | 0 | Lx | 0 |
FIG. 10(h) PRIOR ART 0 0 1 0 0 1 0 0 0 0 0 1 0 0 1 0 0 0 0 0 0   0 0
FIG. 11(a) PRIOR ART
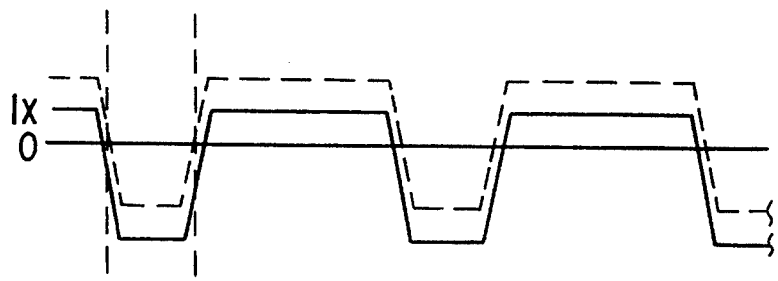
FIG. 11(b) PRIOR ART
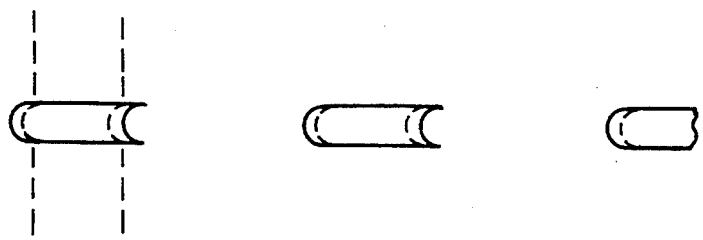
FIG. 11(c) PRIOR ART
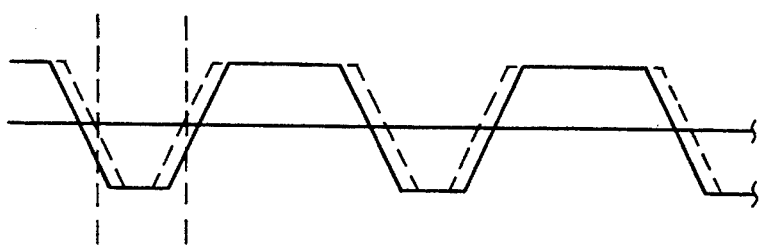
FIG. 11(d) PRIOR ART
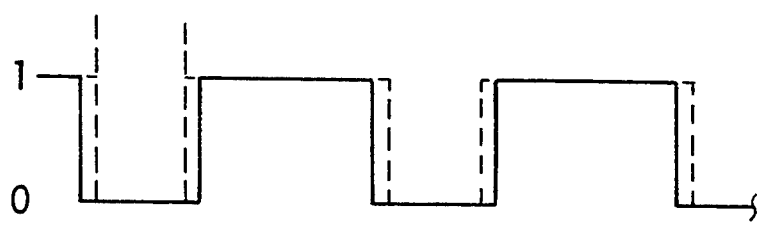
FIG. 11(e) PRIOR ART

INFORMATION REPRODUCING CIRCUIT

This is a Continuation of application Ser. No. 07/920,347 filed Jul. 27, 1992, now abandoned.

FIELD OF THE INVENTION

The present invention relates to an information reproducing circuit for use in information recording-reproduction apparatuses such as magneto-optical recording-reproduction apparatuses.

BACKGROUND OF THE INVENTION

For example, one of the prior art magnetic head driving circuits, wherein the magnetic field modulation system is adopted, is found in Japanese Laid-Open Patent Application No. 63-94406. Here, the following description will discuss this prior art system in detail.

When a 2-7RLL code in FIG. 10($a$) is recorded using the NRZI recording system, appearance of bit "1" makes a recording current of a magnetic head reversed. In a magnetic head driving circuit shown in FIG. 9, the reversing of the recording current is conducted by switches 6 and 7.

More specifically, when the switch 6 is turned on (see FIG. 10($b$)) with the switch 7 off (see FIG. 10($c$)), a current $I_1$ is connected to ground from a dc power source 3 by way of an auxiliary coil 2 and the switch 6. Also a current $I_2$ is connected to ground from a dc power source 5 by way of an auxiliary coil 4, a magnetic head coil 1 and the switch 6. Simultaneously as the switches 6 and 7 are reversed, an induced high voltage appears at a connecting point Q between the auxiliary coil 4 and the switch 7. As a result, a driving current $I_x$, different from the current $I_2$, flows through the magnetic head coil 1 in a direction from Q to P.

On the other hand, when the switch 7 is turned on with the switch 6 turned off (see FIG. 10($b$) and ($c$)), the current $I_2$ of the auxiliary coil 4 is connected to ground from the dc power source 5 by way of the auxiliary coil 4 and the switch 7. Also the current $I_1$ of the auxiliary coil 2 is connected to ground from the dc power source 3 by way of the auxiliary coil 2, the magnetic head coil 1 and the switch 7. Simultaneously as the switches 6 and 7 are reversed, a high induced voltage appears at a connecting point P between the auxiliary coil 2 and the switch 6. As a result, a driving current $I_x$, different from the current $I_1$, flows through the magnetic head coil 1 in a direction from P to Q.

Here, FIG. 10($h$) and ($g$) respectively indicate loads in response to "on" and "off" of the switches 6 and 7 when the coil 1 is seen from the side of the auxiliary coils 2 and 4. As illustrated in these drawings, the loads vary to be equal to the value of the impedance (Zx) of the coil 1 or to be zero. However, the inductance (Lx) of the coil 1 is set to be substantially smaller than the inductance (Ld) of the auxiliary coils 2 and 4. That is, the setting is made to satisfy: Lx<<Ld. Therefore, Lx≅0 and Zx≅0. That is, the loads when seen from the side of the auxiliary coils 2 and 4 become virtually zero; thus, the variation of the loads can be virtually ignored.

By the use of the above-mentioned magnetic head driving circuit, information is recorded, for example, by forming recording marks on a magneto-optical disk. The recorded information is then reproduced by an information reproducing circuit in response to a readout signal derived from these recording marks. An example of such an information reproducing circuit is found in Japanese Laid-Open Patent Application No. 1-13658.

This information reproducing circuit is provided with a positive peak-hold circuit and a negative peak-hold circuit. A slice signal is formed by the addition of outputs from both of the peak-hold circuits in an appropriate ratio (for example, 1:1). The level of the readout signal is compared with that of the slice signal; thus, a binary signal is extracted from the readout signal.

However, in the above-mentioned conventional magnetic head driving circuit, when there is a difference in size between the positive component and the negative component of the driving current $I_x$ of the coil 1 (that is, arising a lack of balance), the distance between zero-crossing points in the driving current $I_x$ deviates and the magnitudes of generated magnetic fields in the positive direction and the negative direction become different from each other. As a result, jitter of the recording marks increases.

This problem becomes more obvious in the case where the NRZI recording system for 2-7 RLL code is adopted as a modulation system of the magneto-optical recording-reproduction apparatus. This system, although having an advantage that the recording density can be increased, has a disadvantage that a lot of dc component is contained in the recording current. Therefore, if a recording signal obtained by this system is inputted to the conventional magnetic head driving circuit, the above problem is inevitably presented.

Moreover, when it is arranged to increase the frequency of the recording signal in order to enhance the data transfer rate, Ld should be minimized. As Ld is reduced, Ld becomes as small as Lx. This results in variation of the loads.

Consequently, as illustrated in FIGS. 10($d$) and 10($e$), the balance of the currents $I_1$ and $I_2$ is upset, thereby resulting in a difference therebetween. Since the distance between zero-crossing points in the driving current $I_x$ deviates and the magnitudes of the driving current $I_x$ in the positive direction and the negative direction become different from each other, jitter of the recording marks increases, thereby reducing the reliability of reproduced data.

More specifically, in the case where the positive component and the negative component of the driving current $I_x$ of the coil 1 are different from each other in size, if recording marks (indicated by a solid line in FIG. 11($c$)), which have been recorded according to 2-7 RLL code (see FIG. 11($a$)), are read out by an optical head (not shown), a readout signal, indicated by a solid line in FIG. 11($d$), will be obtained.

On the other hand, in the case where the positive component and the negative component of the driving current $I_x$ of the coil 1 are the same in size (that is, balance each other), if recording marks (indicated by a dashed line in FIG. 11($c$)) are read out by the optical head (not shown), a readout signal, indicated by a dashed line in FIG. 11($d$), will be obtained.

In the conventional information reproducing circuit, a slice signal is obtained by the use of peaks in the positive direction and in the negative direction of an input signal. For example, when the slice signal is formed by using an intermediate level between the peak in the positive direction and the peak in the negative direction (see FIG. 11($d$)), an output signal (see FIG. 11($e$)) of a comparator (not shown) contains jitter to an extreme extent. In comparison with the case where the positive component and the negative component of the driving current $I_x$ balance each other, a period of "1" of the output signal of the comparator is shortened while a period of "0" thereof is lengthened. This forms one of the reasons that reproduced data becomes deteriorated.

Additionally, the above example has described the case where recording marks are shorter than non-recording marks; however, on the contrary, another case may be considered, wherein recording marks are longer than non-recording marks. Here, in comparison with the case where the positive component and the negative component of the driving current $I_x$ balance each other, the period of "1" of the output signal of the comparator is lengthened while the period of "0" thereof is shortened.

Furthermore, the above example has described the case where the slice signal is obtained from the intermediate level between the peak in the positive direction and the peak in the negative direction. However, in another case, if a slice signal, which is obtained by addition of the peaks in the positive direction and in the negative direction in an appropriate ratio, is used, in other words, if a slice signal having a level that deviates from the intermediate level is used, jitter will be reduced in either "0" or "1"; however, jitter will be increased in the other "1" or "0".

SUMMARY OF THE INVENTION

It is an object of the present invention to provide an information reproducing circuit for accurately converting a signal, read out from a recording medium, into binary digits.

In order to achieve the above objective, the information reproducing circuit of the present invention has a generating means, having virtually the same frequency transfer characteristic as a recording means, for generating a slice signal whose level is larger than a negative peak level of the signal read out from the recording medium and smaller than a positive peak level thereof and a comparator for comparing the level of the readout signal and that of the slice signal so as to convert the readout signal into binary digits. The information reproducing circuit is thus designed to cancel jitter, contained in the readout signal, which occurs due to the frequency transfer characteristic of the recording means by using the level variation of the slice signal which occurs due to the frequency transfer characteristic of the generating means.

In accordance with the above arrangement, a signal read out from the recording medium, even if jitter is contained therein, can be accurately converted into binary digits. Therefore, reliability of the reproduced data can be enhanced.

For a fuller understanding of the nature and advantages of the invention, reference should be made to the ensuing detailed description taken in conjunction with the accompanying drawings.

BRIEF DESCRIPTION OF THE DRAWINGS

FIGS. 1 through 7 illustrate a first embodiment of the present invention.

FIG. 1 is a circuit diagram illustrating a main part of an information reproducing circuit of a magneto-optical recording-reproduction apparatus.

FIG. 2 is a diagram illustrating an equivalent circuit of a magnetic head driving circuit and a magnetic head coil of FIG. 1.

FIG. 3 is a circuit diagram illustrating a filter circuit of FIG. 1.

FIGS. 4(a)-4(e) are diagrams illustrating waveforms of respective parts of FIG. 1.

FIG. 5 is an explanatory diagram illustrating the relationship of $\Delta I_x$ and $\Delta T$ in FIG. 4.

FIGS. 7(a)-7c) are diagrams illustrating waveforms of the respective parts of FIG. 6 in detail.

FIGS. 9 through 11 show the prior art.

FIG. 9 is a circuit diagram illustrating a conventional magnetic head driving circuit and a conventional magnetic head coil.

FIGS. 10(a)-10(h) are diagrams illustrating waveforms of the respective parts of FIG. 9.

FIGS. 11(a)-11(e) are diagrams illustrating waveforms of respective parts of a conventional information recording-reproduction circuit.

DESCRIPTION OF THE EMBODIMENTS

Referring to FIGS. 1 through 7, the following description will discuss the first embodiment of the present invention.

Figure 1:
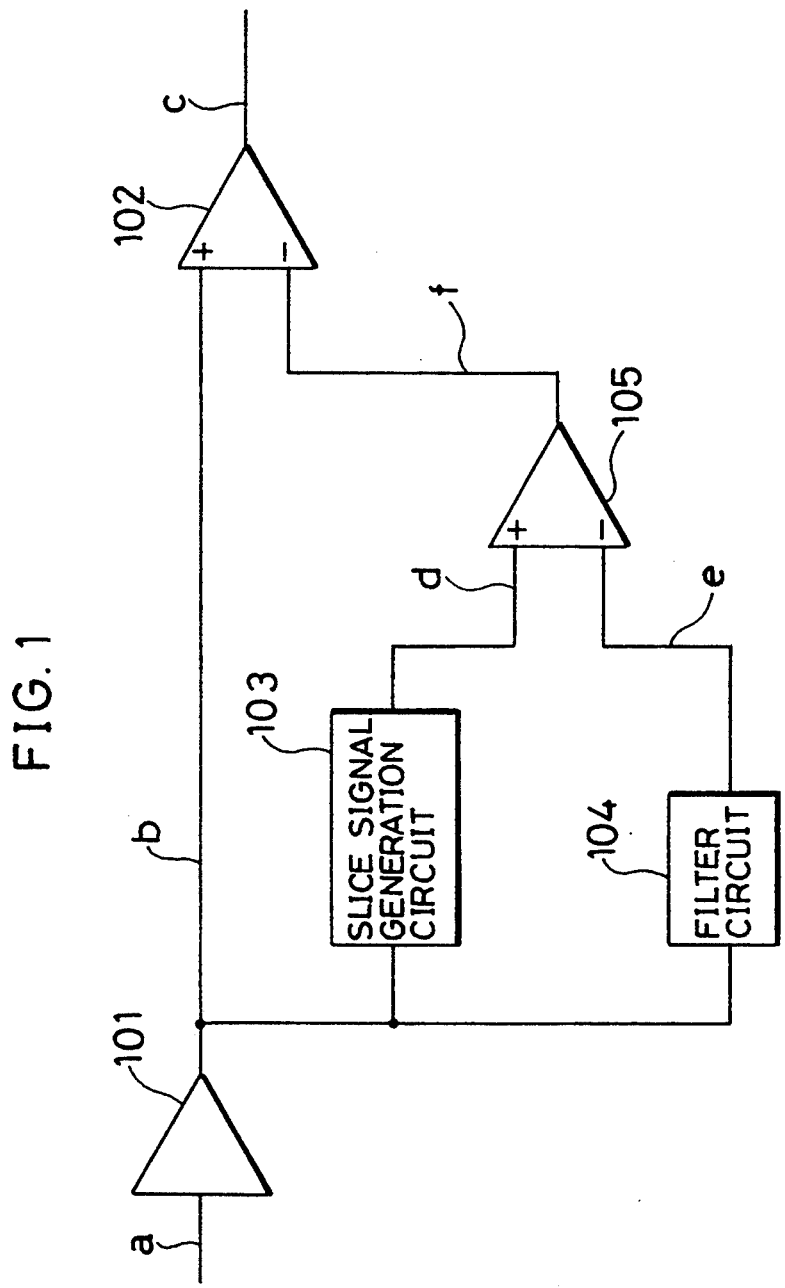

FIG. 1 illustrates an information reproducing circuit of a magneto-optical recording-reproduction apparatus of the present invention.

A readout signal a from a magneto-optical recording medium is amplified by an amplifier 101. An output signal b from the amplifier 101 is sent to a positive input terminal of a comparator 102, a slice signal generating circuit 103 and a filter circuit 104. In the slice signal generating circuit 103, a slice signal d is generated in accordance with the output signal b. The output signal b is influenced by fluctuation of mark lengths caused by the frequency response characteristic of a magnetic head driving circuit including a coil 1 of a magnetic head.

Figure 6A:
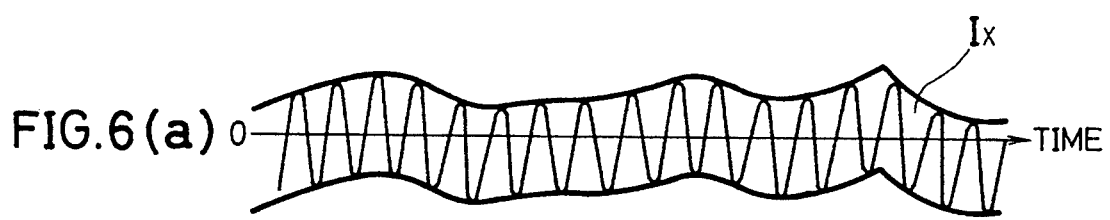
FIGS. 6(a)-6(e) are diagrams illustrating waveforms of the respective parts when reproduction is conducted by the information reproducing circuit of FIG. 1 under the influence of frequency transfer functions of the magnetic head driving circuit and the magnetic head coil.
Figure 6B:
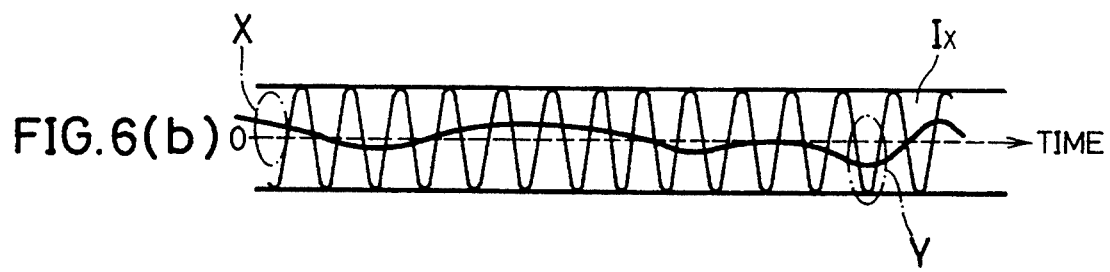

As illustrated in FIG. 6(a), a driving current $I_x$, which is applied to the coil 1 of the magnetic head, varies dependent on the various positioning of the recorded data. This is because the frequency response characteristic of the magnetic head driving circuit including the coil 1 of the magnetic head are expressed by a frequency transfer function of an equation (3), which will be described later. When the waveform of FIG. 6(a) is reformed so as to make the level of its envelope constant, a waveform having a variation in its zero level is obtained, as shown in FIG. 6(b). Here, an optimal zero level is located in the center between the positive and negative envelopes, as is given by a dashed line in FIG. 6(b).

The variation of the zero level causes the length of recording marks to be formed on the magneto-optical disk to vary. That is, when the zero level is lowered (see a portion indicated by Y in FIG. 6(b)), the recording marks become longer than a predetermined length. When the zero level is raised (see a portion indicated by X in FIG. 6(b)), the recording marks become shorter than the predetermined length.

Figure 2:
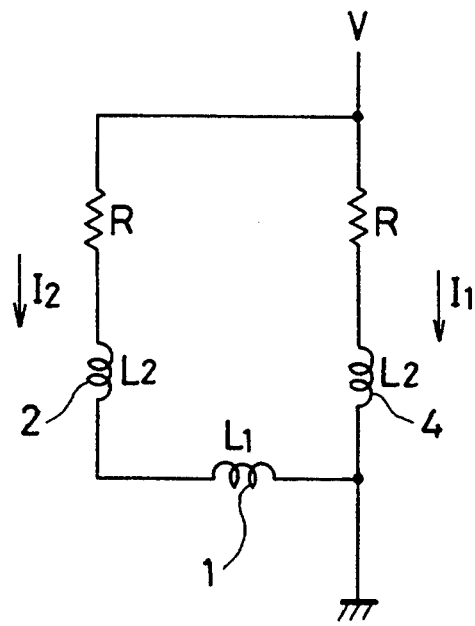
Figure 9:
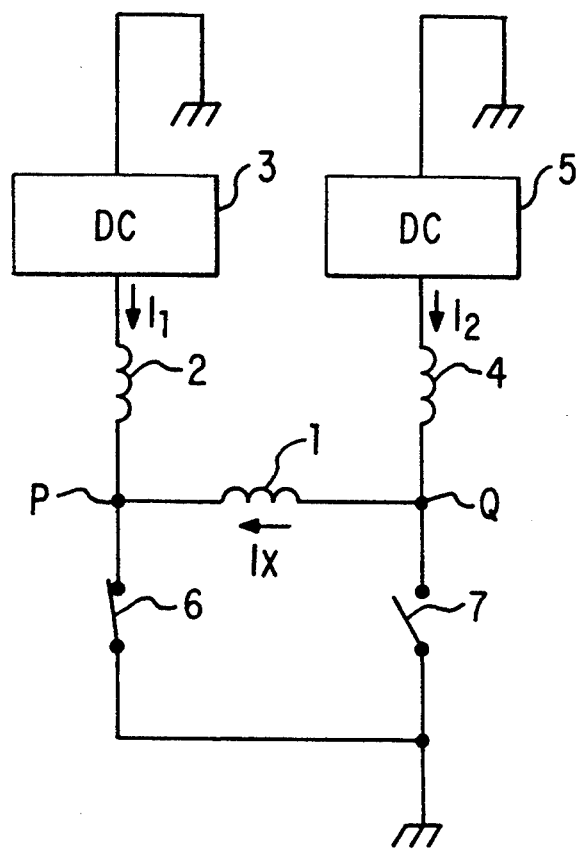

FIG. 2 is a diagram of an equivalent circuit of a conventional magnetic head driving circuit (see FIG. 9).

Resistors R in FIG. 2 indicate the total equivalent resistance of the switch 6 and the dc power source 3 and the total equivalent resistance of the switch 7 and the dc power source 5. Voltage V (volt) is an output voltage of the dc power sources 3 and 5.

First, $Z_1$ and $Z_2$ are defined as follows:

$$Z_1 = R + j \cdot \omega \cdot L_2 \tag{1}$$

$$Z_2 = R + j \cdot \omega \cdot L_2 + j \cdot \omega \cdot L_1 \tag{2}$$

where $L_1$ is an inductance of the coil 1; $L_2$ is an inductance of the auxiliary coil 2 as well as the auxiliary coil 4; $\omega$ is an angular frequency; and $j = (-1)^{\frac{1}{2}}$.

In FIG. 2 and FIG. 4(b), when currents having the positive and negative directions to be applied to the coil 1 of the magnetic head are respectively designated as $I_1$ and $I_2$, these currents are equivalent to respective average currents of the auxiliary coil 2 and the auxiliary coil 4. Here, when one time ratio during which the current is flowing from the auxiliary coil 2 to the ground terminal is designated as $\beta$ and the other time ratio during which the current is flowing from the auxiliary coil 2 to the coil 1 of the magnetic head is represented by $(1-\beta)$, the average current $I_1$ of the auxiliary coil 2 is represented by:

$$I_1 = \beta \times (V/Z_1) + (1-\beta) \times (V/Z_2).$$

Also, the average current $I_2$ of the auxiliary coil 4 is represented by:

$$I_2 = (1-\beta) \times (V/Z_1) + \beta \times (V/Z_2).$$

Since the amount of deviation $\Delta I_x$ of the driving current $I_x$ is represented by the difference between these values, the following equation holds:

$$\begin{aligned}\Delta I_x &= (I_1 - I_2)/2 \\ &= V \times (\beta - 1/2) \times (1/Z_1 - 1/Z_2).\end{aligned} \tag{3}$$

When the dc component of the driving current $I_x$ is zero, $\beta = (1-\beta)$, that is, $\beta = \frac{1}{2}$. Therefore, $\Delta I_x = 0$ holds. Here, for convenience of explanation, $\beta$ is given as the time ratio with respect to the dc component of the driving current $I_x$; yet, in fact, it is given as the time ratio with respect to the low frequency component of the driving current $I_x$.

The equation (3) is a frequency transfer function that is applied to the magnetic head driving circuit and the magnetic head coil.

Figure 3:
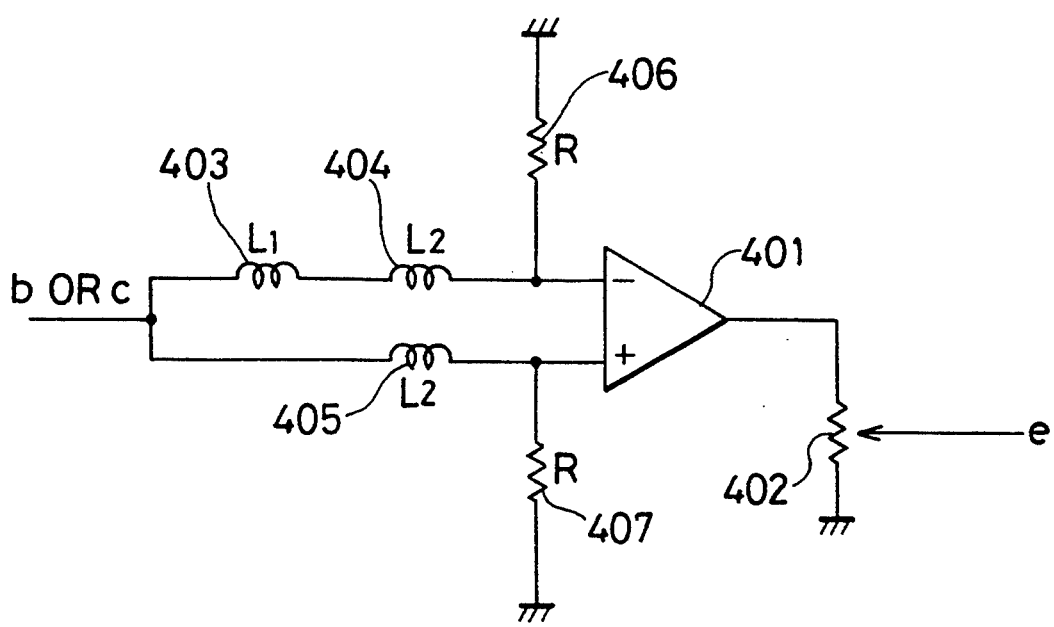

FIG. 3 shows one example of a circuit configuration of the filter circuit 104 which is arranged so that the same frequency transfer function as FIG. 2 is applied thereto. More specifically, the filter circuit 104 is constituted by a coil 403 having the inductance $L_1$, coils 04 and 405, both having the inductance $L_2$, resistors 406 and 407 having the resistance R, a subtracting amplifier 401 and a variable resistor 402. The coil 403 is connected in series with the coil 404. One end of these coils 403 and 404 is connected to a negative input terminal of the subtracting amplifier 401 while the other end thereof is connected to an output of the amplifier 101. One end of the coil 405 is connected to a positive input terminal of the subtracting amplifier 401 while the other end thereof is connected to an output of the amplifier 101.

A negative input terminal of the subtracting amplifier 401 is connected to ground through the resistor 406. A positive input terminal of the subtracting amplifier 401 is connected to ground through the resistor 407. On the other hand, an output of the subtracting amplifier 401 is connected to ground through the variable resistor 402, thereby permitting the variable resistor 402 to release an output signal e (that is, an output of the filter circuit 104).

Here, designating that the voltage of the output signal b from the amplifier 101 is $V_{in}$ and the voltage of the output signal e from the filter circuit 104 is $V_{out}$ and that the total amplification of the subtracting amplifier 401 and the variable resistor 402 is $\alpha$, the following equation (4) holds:

$$V_{out}/V_{in} = (1/Z_1 - 1/Z_2) \times R \times \alpha \tag{4}$$

where $Z_1$ and $Z_2$ respectively satisfy the foregoing equations (1) and (2).

The equation (4) is a frequency transfer function of the filter circuit 104; thus, by adjusting $\alpha$ appropriately, the equation (4) becomes virtually equal to the frequency transfer function of the magnetic head driving circuit including the coil of the magnetic head of FIG. 9. Therefore, an output that is formed in accordance with the frequency transfer function of the magnetic head driving circuit including the coil of the magnetic head is released from the filter circuit 104.

The slice signal d released from the slice signal generating circuit 103 is sent to a positive input terminal of a subtracter 105, while the output signal e of the filter circuit 104 is sent to a negative input terminal of the subtracter 105. In the subtracter 105, a slice signal f, obtained by subtracting the output signal e from the slice signal d, is sent to the negative input terminal of the comparator 102. The comparator 102 compares the slice signal f and the output signal b in their levels and produces a digital signal c which is to be reproduced.

Figure 6C:
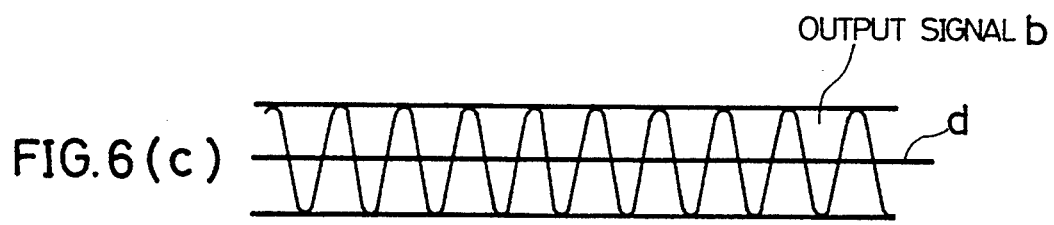
Figure 6D:
Figure 6E:
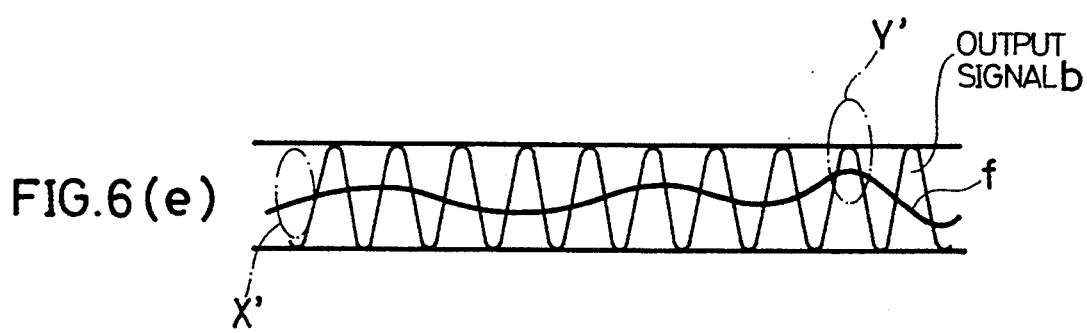
Figure 7:
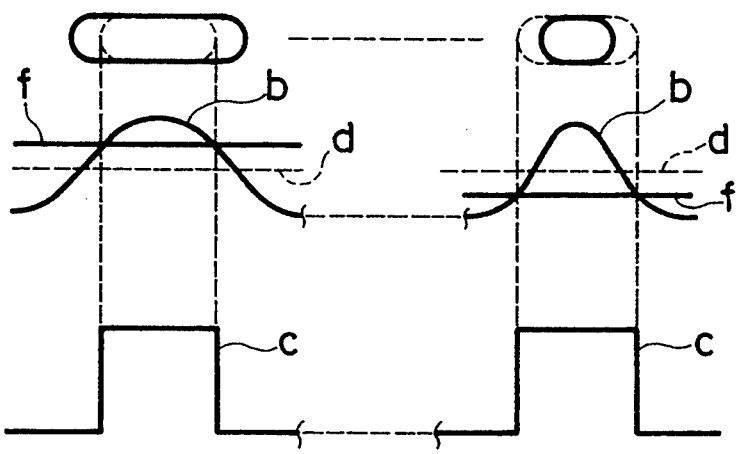

Referring to FIGS. 6 and 7, the following description will discuss an operation of the information reproducing circuit of the magneto-optical recording-reproduction apparatus of the present invention.

The slice signal d is generated in the slice signal generating circuit 103 in accordance with the output signal b of the amplifier 101 (see FIG. 6(c)). On the other hand, the output signal b that has been inputted to the filter circuit 104, is changed into the signal e having a waveform as shown in FIG. 6(d) because the filter circuit 104 has virtually the same frequency transfer function as the magnetic head driving circuit including the coil of the magnetic head.

The output signal e of the filter circuit 104, after having undergone subtraction from the slice signal d in the subtracter 105, forms the slice signal f (see FIG. 6(e)) which is sent to the negative input terminal of the comparator 102. The comparator 102 compares the slice signal f and the output signal b in their levels and produces a digital signal c which is to be reproduced.

For example, if a recording mark (see FIG. 7(a)), which has been recorded with a longer form than a predetermined length due to the variation of the driving current $I_x$ caused under the influence of the frequency transfer function of the magnetic head driving circuit including the coil 1 of the magnetic head, is reproduced, the reproduced signal (the output signal b of the amplifier 101) has a peak whose time width is generally longer than a predetermined length. However, in accordance with the present invention, the slice signal f derived from the recording mark having the longer form becomes larger (see FIG. 7(b) and the portion indicated by Y' in FIG. 6(e)), and thus the recording mark is reproduced as a peak with a shorter width; therefore, as a result the same mark signal (digital signal c) as that obtained by reproducing a recording mark with the predetermined length can be provided (see FIG. 7(c)).

On the other hand, if a recording mark (see FIG. 7(a)), which has been recorded with a shorter form than a predetermined length is reproduced, the reproduced signal (the output signal b of the amplifier 101) has a peak whose time width is generally shorter than a predetermined length. However, in accordance with the present invention, the slice signal f derived from the recording mark having the shorter form becomes smaller (see FIG. 7(b) and the portions indicated by X' in FIG. 6(e)), and thus the recording mark is reproduced as a peak with a longer width; therefore, as a result the same mark signal (digital signal c) as that obtained by reproducing a recording mark with the predetermined length can be provided (see FIG. 7(c)).

Here, dashed lines in FIG. 7(a) indicate recording marks, having a predetermined length, which will be formed where there is no fluctuation in the driving current $I_x$. Dashed lines in FIG. 7(b) indicate a slice signal d.

As described above, since the frequency transfer characteristic of the magnetic head driving circuit including the coil 1 of the magnetic head is cancelled, it is ensured that jitter in the digital signal c, that is, in an output signal of the comparator 102, can be reduced even if jitter occurs in the recording marks.

Figure 4:
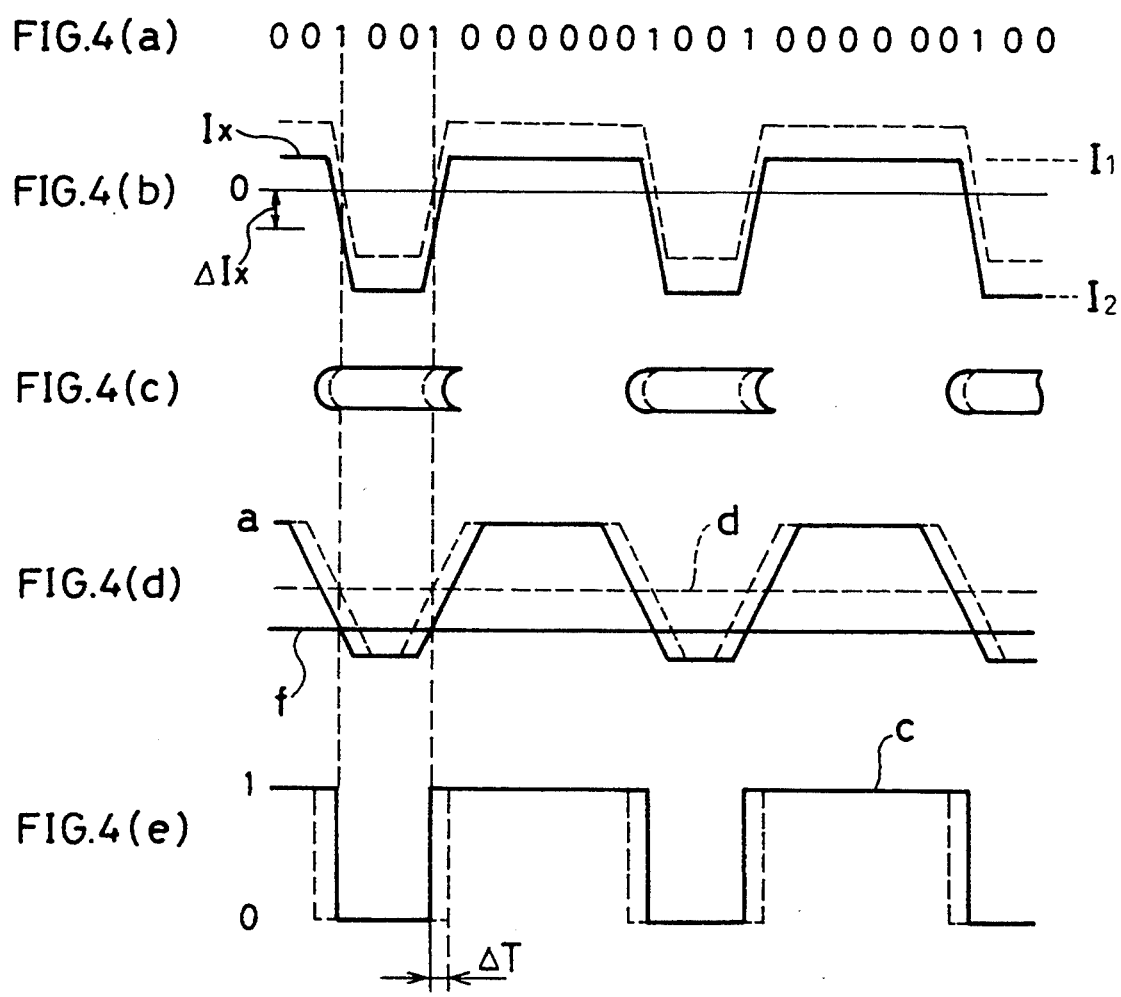

Referring to FIG. 4, the following description will discuss a circuit operation of FIG. 1.

When the 2-7 RLL code of FIG. 4(a) is recorded on a magneto-optical recording medium by the use of the NRZI recording system, the driving current $I_x$ (indicated by a solid line in FIG. 4(b)) is lowered by $\Delta I_x$ under the influence of the frequency transfer characteristic of the magnetic head driving circuit including the coil 1 of the magnetic head in comparison with a normal level (indicated by a dashed line in FIG. 4(b)). This lowering causes the recording marks to be lengthened (indicated by solid lines in FIG. 4(c)) and the waveform of the readout signal is thus varied (indicated by solid lines in FIG. 4(d)).

Here, in order to compensate for the lowering, the slice signal f (indicated by a solid line in FIG. 4(d)) is lowered with respect to the slice signal d (indicated by a dashed line in FIG. 4(d)). Therefore, in comparison with jitter $\Delta T$ (indicated by a dashed line in FIG. 4(e)), which occurs in the output signal c when the comparator 102 has compared the output signal b and the slice signal d, jitter (indicated in FIG. 4(e)), which occurs in the output signal c when the comparator 102 has compared the output signal b and the slice signal f, is positively reduced.

Figure 5:
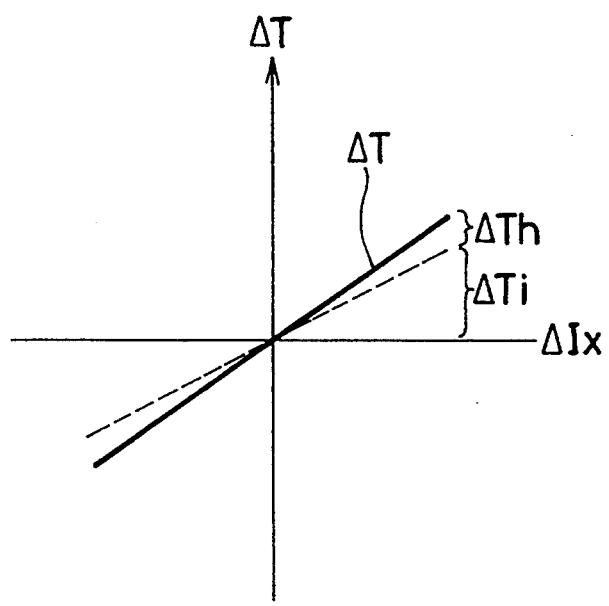

FIG. 5 shows the results of measurements with respect to the relationship between the deviation $\Delta I_x$ of the driving current $I_x$ and the jitter $\Delta T$ of the output signal c.

Here, $\Delta T_i$ is a Jitter component in $\Delta T$ that occurs due to deviations of the space between zero-crossing points of the driving current $I_x$. On the other hand, $\Delta T_h$ is a Jitter component in $\Delta T$ that occurs due to differences of the magnitudes of magnetic fields generated in the positive direction and the negative direction. Here, the following equation (5) holds among $\Delta T$, $\Delta T_i$ and $\Delta T_h$:

$$\Delta T = \Delta T_i + \Delta T_h \quad (5)$$

As shown in FIG. 5, $\Delta T$ is directly proportional to $\Delta I_x$. In other words, $\Delta I_x$ occurs due to the frequency transfer characteristic of the magnetic head driving circuit including the coil 1 of the magnetic head; and $\Delta T$ is thus produced in proportion to $\Delta I_x$. Here, compensation is provided for the slice signal d by the use of the filter circuit 104 and the subtracter 105 and the comparator 102 compares the output signal b and the slice signal f in their levels; this proportionally reduces $\Delta T$.

More specifically, the frequency transfer function of the magnetic head, shown in FIG. 2, is made virtually the magnetic head driving circuit including the coil 1 of identical to the frequency transfer function of the filter circuit 104, shown in FIG. 3; and compensation is provided for the sum of proportional coefficients of the above functions by the use of the variable resistor 402. Thus, these operations make it possible to cancel $\Delta T$ which has the same phase as the driving current $\Delta I_x$ and a proportional amount thereto.

For convenience of explanation, FIG. 4 exemplifies only the case where the recording marks are set to be shorter than the non-recording marks. However, the present invention is not necessarily limited to this arrangement, and depending on data, is adaptable for another arrangement where the recording marks are longer than the non-recording marks. In this case, the same effect as the embodiment can be obtained although the readout signal a and the output signal c are inverted.

Figure 8:
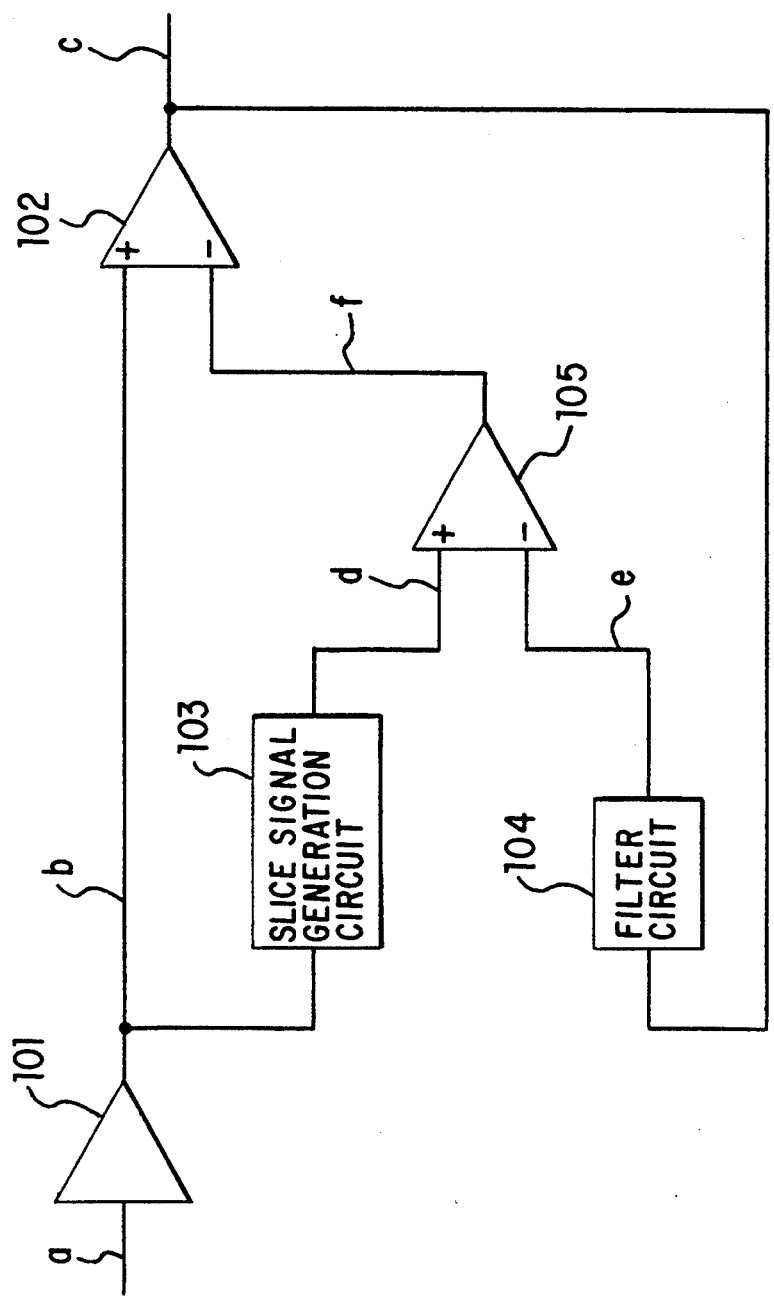
FIG. 8, which shows a second embodiment of the present invention, is a circuit diagram illustrating a main part of an information reproducing circuit of a magneto-optical recording-reproduction apparatus.

FIG. 8 illustrates the second embodiment of an information reproducing circuit of a magneto-optical recording-reproduction apparatus of the present invention. Here, those members that have the same functions and that are described in the first embodiment are indicated by the same reference numerals and the description thereof is omitted.

The present embodiment is different from the first embodiment in that the output signal c from the comparator 102 is inputted to the filter circuit 104 instead of the output signal b from the amplifier 101.

By inputting the output signal c of the comparator 102 to the filter circuit 104, it is ensured that the influence of the frequency transfer characteristic of the magnetic head driving circuit including the coil 1 of the magnetic head, which is contained in the output signal c, can be eliminated. Therefore, as with the first embodiment, this arrangement makes it possible to remarkably reduce jitter in the output signal c of the comparator 102, even if jitter occurs in the recording marks.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An information reproducing circuit for converting into binary digits a reproduced signal read out from a recording medium whereon information has been recorded as a recording signal by a recording means, and said reproducing circuit having an amplitude jitter eliminating means for receiving said reproduced signal and for eliminating jitter therefrom which is related to amplitude variations in said reproduced signal as compared to said recording signal and for removing low frequency components superimposed upon the readout signal, and phase jitter eliminating means for receiving said reproduced signal and eliminating jitter therefrom, said jitter is related to phase variations in said reproduced signal as compared to said recording signal, said reproducing circuit including a subtracting circuit receiving as inputs an output of said amplitude jitter eliminating means and an output of said phase jitter eliminating means; and a comparator receiving as inputs said reproduced signal and an output of said subtracting circuit.

2. The reproducing circuit of claim 1, wherein said amplitude jitter eliminating means includes a slice signal generating circuit which generates a slice signal whose level is larger than a negative peak level of the reproduced signal and smaller than a positive peak level thereof.

3. The reproducing circuit of claim 1 wherein said phase jitter eliminating means includes a filter having virtually the same frequency transfer characteristic as a magnetic head driving circuit of said recording means.

4. The reproducing circuit of claim 3, wherein said filter has a plurality of resistors and inductors, and said magnetic head driving circuit has a corresponding plurality of resistors and inductors.

5. The reproducing circuit of claim 4, wherein said resistors and inductors in said filter and corresponding resistors and inductors in said magnetic head driving circuit have virtually identical values.

6. An information reproducing circuit of a magneto-optical recording-reproduction apparatus and having an amplifier for receiving a read-out signal from magneto-optical recording medium and providing an amplified readout signal therefrom a comparator circuit having a positive input for receiving the amplified readout signal from said amplifier, a slice signal generating circuit for receiving the amplified readout signal from said amplifier and providing a slice signal therefrom, a filter circuit for receiving the amplified readout signal from said amplifier and providing a filtered signal therefrom;

said reproducing circuit including;

a subtractor circuit having a positive input for receiving said slice signal and a negative input for receiving said filtered signal, said subtractor circuit providing a further slice signal therefrom for supplying to a negative input of said comparator circuit, said comparative circuit comparing said amplified readout signal and said further slice signal to provide a reproduced digital signal.

7. An information reproducing circuit of a magneto-optical recording-reproduction apparatus and having an amplifier for receiving a read-out signal from a magneto-optical recording medium and providing an amplified readout signal therefrom, a comparator circuit having a positive input for receiving the amplified readout signal from said amplifier, said comparator circuit providing a reproduced digital signal, a slice signal generating circuit for receiving the amplified readout signal from said amplifier and providing a slice signal therefrom, a filter circuit for receiving the reproduced digital signal from said comparator circuit and providing a filtered signal therefrom said reproducing circuit including;

a subtractor circuit having a positive input for receiving said slice signal and a negative input for receiving said filtered signal for providing a further slice signal therefrom for supplying to a negative input of said comparator circuit, said comparator circuit comparing said amplified readout signal and said further slice signal to provide said reproduced digital signal.

8. An information reproducing circuit for converting into binary digits a reproduced signal read out from a recording medium whereon information has been recorded as a recording signal by a recording means, said reproducing circuit having:

amplitude jitter eliminating means for receiving said reproduced signal and for eliminating jitter therefrom which is related to amplitude variations in said reproduced signal as compared to said recording signal and for removing low frequency components superimposed upon the readout signal, phase jitter eliminating means for receiving a below mentioned comparator output signal and providing an output signal therefrom, a subtracting circuit receiving as inputs an output of said amplitude jitter eliminating means and an output of said phase jitter eliminating means; and a comparator receiving as inputs said reproduced signal and an output of said subtracting circuit to produce a comparator output signal.

9. The reproducing circuit of claim 8, wherein said amplitude jitter eliminating means includes a slice signal generating circuit which generates a slice signal whose level is larger than a negative peak level of the reproduced signal and smaller than a positive peak level thereof.

10. The reproducing circuit of claim 8, wherein said phase jitter eliminating means includes a filter having virtually the same frequency transfer characteristic as a magnetic head driving circuit of said recording means.

11. The reproducing circuit of claim 10, wherein said filter has a plurality of resistors and inductors, and said magnetic head driving circuit has a corresponding plurality of resistors and inductors.

12. The reproducing circuit of claim 11, wherein said resistors and inductors in said filter and corresponding resistors and inductors in said magnetic head driving circuit have virtually identical values.

* * * * *

UNITED STATES PATENT AND TRADEMARK OFFICE
CERTIFICATE OF CORRECTION

PATENT NO. : 5,444,688
DATED : August 22, 1995
INVENTOR(S) : H. Fuji

It is certified that error appears in the above-indentified patent and that said Letters Patent is hereby corrected as shown below:

On the Title page, please insert

-- [30]        Foreign Application Priority Data

August 2, 1991 [JP]      Japan ...........................3-194349 --

Signed and Sealed this

Sixteenth Day of January, 1996

Attest:

BRUCE LEHMAN

*Attesting Officer*      *Commissioner of Patents and Trademarks*